(12) United States Patent
Stegmeir

(10) Patent No.: US 8,193,843 B1
(45) Date of Patent: Jun. 5, 2012

(54) CHARGE PUMP TRACKING CIRCUIT FOR A PHASE LOCK LOOP

(75) Inventor: David Conrad Stegmeir, San Jose, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 43 days.

(21) Appl. No.: 12/823,669

(22) Filed: Jun. 25, 2010

Related U.S. Application Data

(60) Provisional application No. 61/245,906, filed on Sep. 25, 2009.

(51) Int. Cl.
*H03L 7/06* (2006.01)
(52) U.S. Cl. .......... 327/157; 327/148; 327/534
(58) Field of Classification Search ............ 327/148, 327/157, 534–537
See application file for complete search history.

(56) References Cited

U.S. PATENT DOCUMENTS

| | | | |
|---|---|---|---|
| 4,156,855 A | 5/1979 | Crowley | |
| 5,068,626 A | 11/1991 | Takagi et al. | |
| 5,473,283 A | 12/1995 | Luich | |
| 5,576,647 A | 11/1996 | Sutardja et al. | |
| 5,623,523 A | 4/1997 | Gehrke | |
| 6,177,831 B1 * | 1/2001 | Yoneda et al. | 327/537 |
| 6,888,386 B2 | 5/2005 | Peng | |
| 7,005,896 B2 * | 2/2006 | Chen et al. | 327/112 |
| 7,474,139 B2 * | 1/2009 | Tanzawa | 327/534 |
| 2005/0230730 A1 * | 10/2005 | Tanzawa | 257/296 |
| 2006/0033554 A1 * | 2/2006 | Matsunami et al. | 327/536 |

OTHER PUBLICATIONS

Arshak, Khalil et al., "Improved Charge Pump for Reduced clock feed through and Charge Sharing Suppression," Proceedings of the Fifth IEEE International Caracas Conference on Devices, Circuits and Systems, Nov. 3-5, 2004, pp. 192-194, IEEE.

Cheng, Shanfeng et al., "Design and Analysis of an Ultrahigh-Speed Glitch-Free Fully Differential Charge Pump With Minimum Output Current Variation and Accurate Matching," IEEE Transactions on Circuits and Systems -II: Express Briefs, vol. 53. No. 9 Sep. 2006, pp. 843-847, IEEE.

Sun, Yuan et al., "Design of a High Performance Charge Pump Circuit for Low Voltage Phase-Locked Loops," 2007 IEEE International Symposium on Integrated Circuits, 2007, pp. 271-274, IEEE.

Yamagishi, Akihiro et al., "A 1-V 2.4-GHz PLL Synthesizer with a Fully Differential Prescaler and a Low-Off-Leakage Charge Pump," 2003 IEEE MTT-S Digest, 2003, pp. 733-736, IEEE.

Yang, Zhenyu et al., "A Fully Differential Charge Pump with Accurate Current Matching and Rail-to-Rail Common-Mode Feedback Circuit," IEEE International Symposium on Circuits and Systems, 2008, pp. 448-451, IEEE.

* cited by examiner

*Primary Examiner* — Patrick O'Neill
(74) *Attorney, Agent, or Firm* — Withrow & Terranova, P.L.L.C.

(57) ABSTRACT

Disclosed is an apparatus and method for controlling the voltage drop across output transistors in a charge pump.

15 Claims, 3 Drawing Sheets

CHARGE PUMP TRACKING CIRCUIT FOR A PHASE LOCK LOOP

This application claims benefit to U.S. Provisional Patent Application No. 61/245,906, filed on Sep. 25, 2009, and which is incorporated herein by reference.

FIELD OF THE DISCLOSURE

The present invention relates to charge pumps and more specifically relates to charge pumps used to control voltage controlled oscillator circuits (VCO).

BACKGROUND OF THE DISCLOSURE

Prior charge pumps have almost the full supply voltage across one the output transistors when the output voltage of the charge pump output voltage is either near ground or near the supply. This limits the charge pump supply voltage to slightly more than the maximum operating voltage of the devices used to implement the charge pump. As geometries of semiconductor devices have decreased, the design of voltage control oscillators have had to trade off smaller design geometries with increased voltage to frequency constants of the VCO. However, the increased voltage to frequency constant is associated with increased phase noise and decreased VCO performance.

Thus, there is a need for an improved charge pump design to permit implementation of charge pump circuits with smaller geometry semiconductor devices.

Summary of the Disclosure

The present disclosure relates to a charge pump. One exemplary charge pump includes a first pass transistor and a second pass transistor coupled to create a charge pump output. A first controlled current source is coupled to the first pass transistor and a second controlled current source is coupled to the second pass transistor. A tracking circuit receives the charge pump output and provides two reference voltages. The first reference voltage is coupled to the well of the first pass transistor. The second reference voltage is coupled to the well of the second pass resistor. The tracking circuit is configured to track the charge pump output in order to regulate the voltages across the first pass transistor and the second pass transistor.

Another example charge pump includes generating a charge pump voltage output with a first pass transistor and a second pass transistor. A potential between a well voltage of the first pass transistor relative to the charge pump voltage output and the potential between the charge pump output voltage and a well voltage of the second pass transistor are controlled to be substantially the same.

Those skilled in the art will appreciate the scope of the disclosure and realize additional aspects thereof after reading the following detailed description in association with the accompanying drawings.

BRIEF DESCRIPTION OF THE DRAWINGS AND FIGURES

The accompanying drawings incorporated in and forming a part of this specification illustrate several aspects of the disclosure, and together with the description serve to explain the principles of the disclosure.

Figure 1:
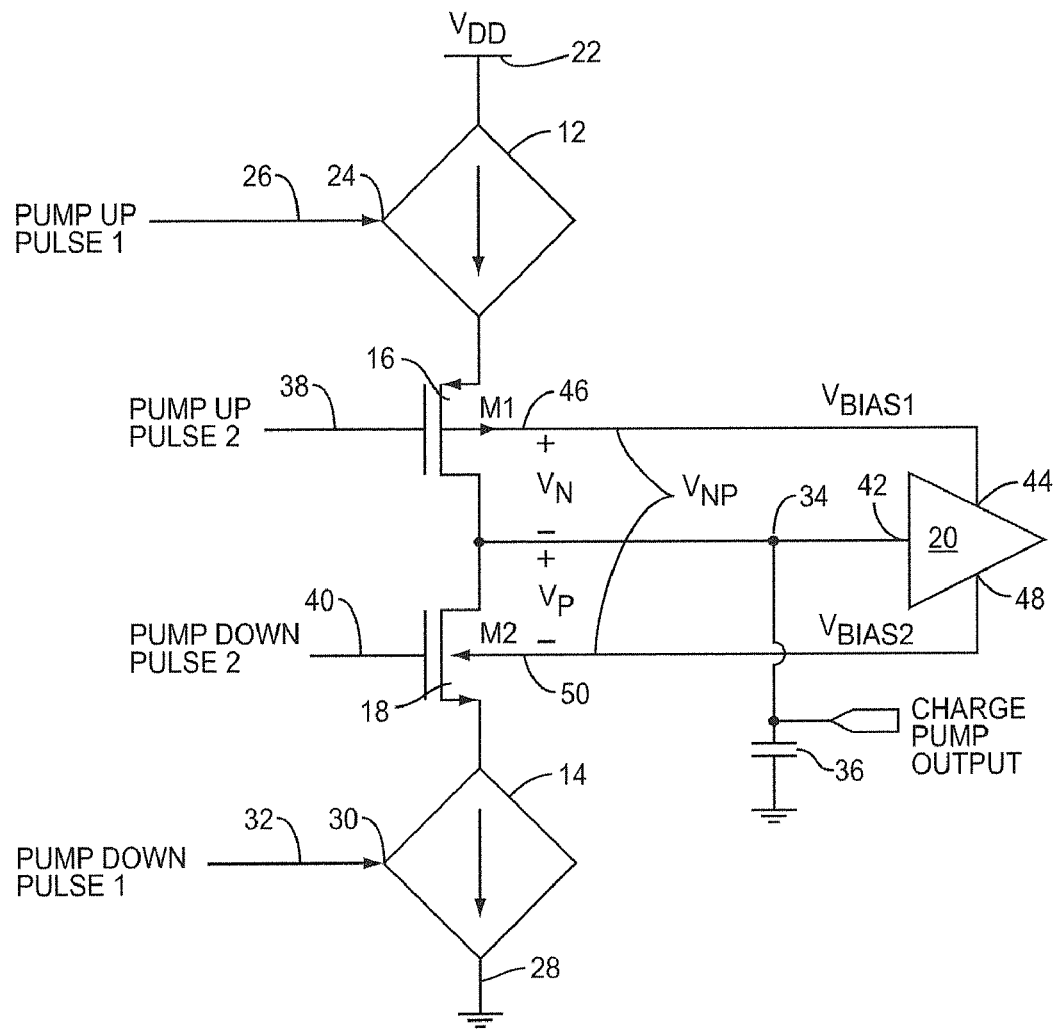
Figure 2:
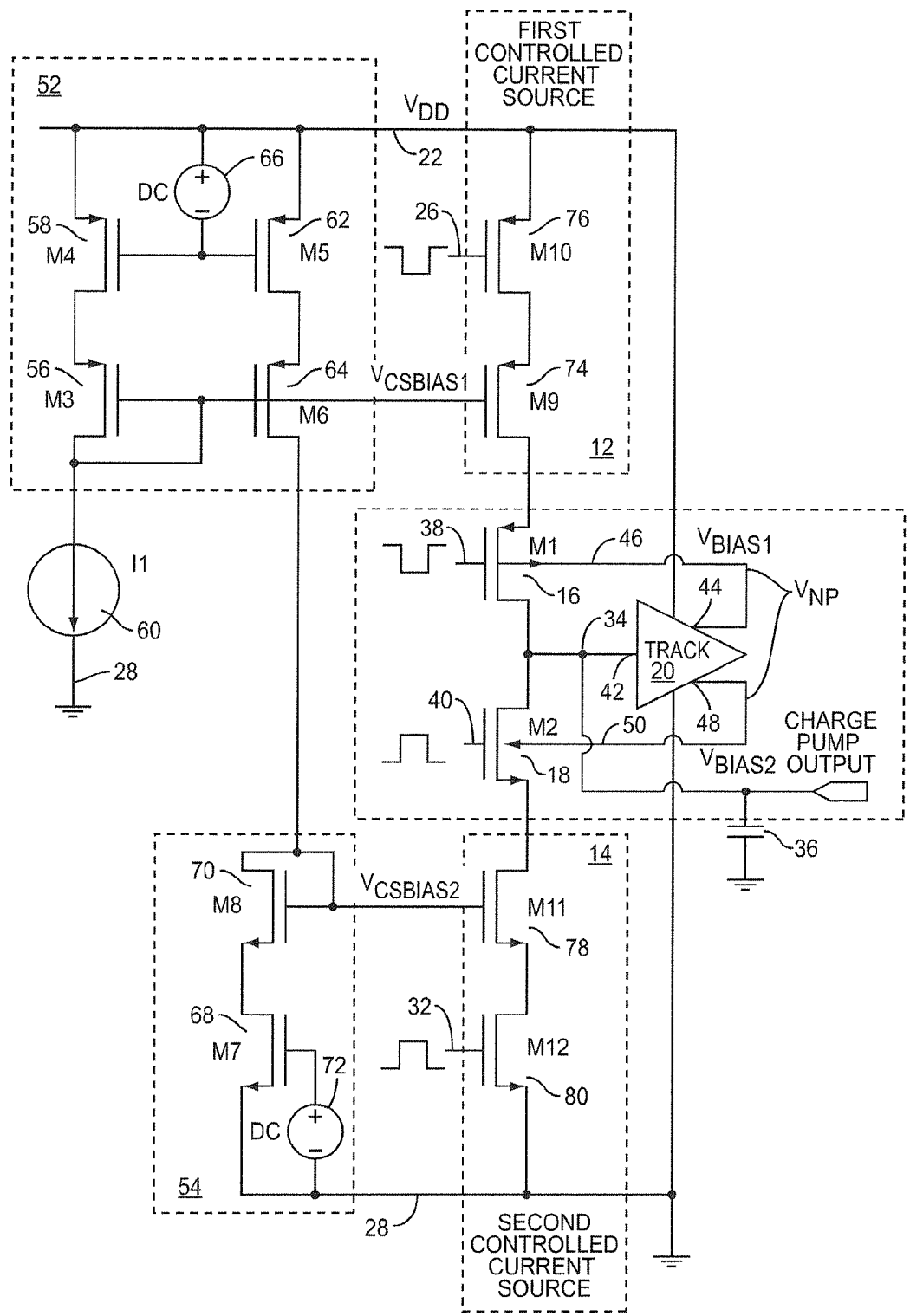
Figure 3:
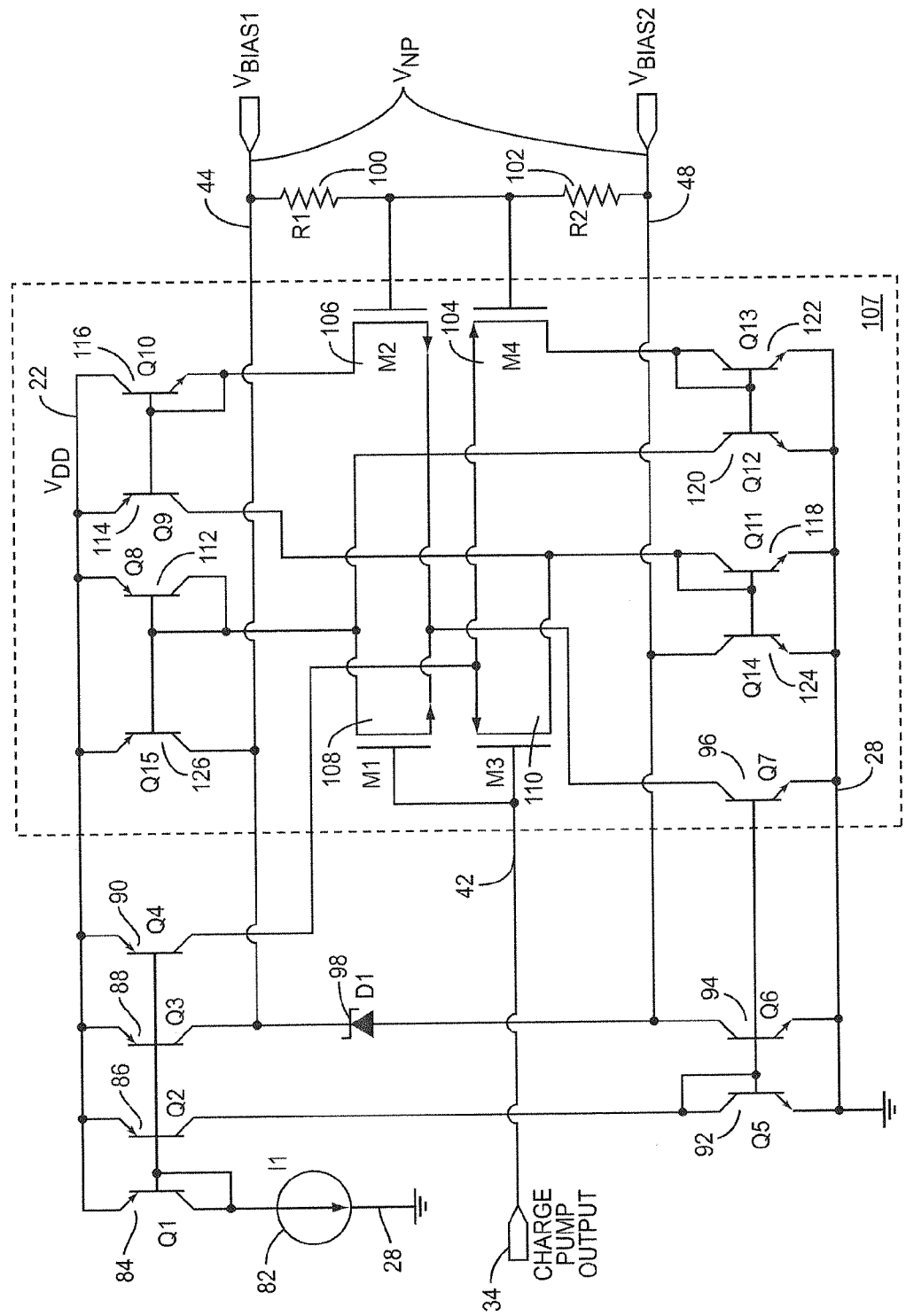

FIG. 1 depicts a first example charge pump.
FIG. 2 depicts a second example charge pump.
FIG. 3 depicts an example tracking circuit of a charge pump.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

While the forgoing description of transistor operation is based upon the operation of field effect transistor devices and bipolar transistors, operation of each transistor may be generalized as having a control input, a first output and a second output. As an example, for a bipolar transistor, the base may correspond to a control input, a collector may correspond to a first output, and an emitter may correspond to a second output. As another example, for a field effect transistor, the gate may correspond to a control input, a drain may correspond to a first output, and a source may correspond to a second output. Accordingly, description based upon a selected type of transistor or family of transistors is by way of illustration only and not by way of limitation.

FIG. 1 depicts a first example of a charge pump 10 including a first controlled current source 12, a second controlled current source 14, a first pass transistor (M1) 16, a second pass transistor (M2) 18, and a tracking circuit 20.

The first controlled current source 12 includes a first node coupled to a supply voltage ($V_{DD}$) 22, a second node coupled to the source of the first pass transistor (M1) 16, and a current control input 24. The current control input 24 of the first controlled current source 12 is configured to receive a first pump up pulse 26, which controls the current provided to the source of the first pass transistor (M1) 16.

The second controlled current source 14 includes a first node coupled to a source of the second pass transistor (M2) 18, a second node coupled to a common supply voltage 28, and a current control input 30. The current control input 30 of the second controlled current source 14 is configured to receive a first pump down pulse 32, which controls the current provided to the source of the second pass transistor (M2) 18.

The drain of the first pass transistor (M1) 16 and the drain of the second pass transistor (M2) 18 are coupled to form a charge pump output 34, which provides current output to a filter 36. Illustratively, the filter may be a capacitor to store charge provided to the filter 36 from the charge pump output 34.

The gate of the first pass transistor (M1) 16 is configured to receive a second pump up pulse 38. The first pump up pulse 26 and the second pump up pulse 38 work in tandem to turn on the first controlled current source 12 and the first pass transistor (M1) 16 to provide current to the charge pump output 34. When both the first controlled current source 12 and first pass transistor (M1) 16 are turned on, current flows to the charge pump output 34, which increases the charge pump voltage. When either the first controlled current source 12 or the first pass transistor (M1) 16 are turned off, current ceases to flow to the charge pump output 34.

The gate of the second pass transistor (M2) 18 is configured to receive a second pump down pulse 40. The first pump down pulse 32 works in tandem with the second pump down pulse 40 to turn on the second controlled current source 14 and the second pass transistor (M2) 18 to sink current from the charge pump output 34. When both the second controlled current source 14 and the second pass transistor (M2) 18 are turned on, current is drawn from the charge pump output 34, which lowers the charge pump output voltage.

Tracking circuit 20 includes a tracking voltage input 42 coupled to the charge pump output 34, a first bias voltage output ($V_{BIAS1}$) 44 coupled to the n-well input 46 of the first pass transistor (M1) 16, and a second bias voltage output ($V_{BIAS2}$) 48 coupled to the p-well input 50 of the second pass transistor M2 (18). The tracking circuit is configured to regulate the first bias voltage output 44 at the n-well input 46 of the first pass transistor (M1) 16 and the second bias voltage output ($V_{BIAS2}$) 48 at the p-well input 50 of the second pass transistor (M2) 18 relative to a charge pump output voltage at the charge pump output 34 such that the potential $V_{NP}$ between the n-well input 46 and the p-well input 50 is substantially constant through the operating range of the charge pump output 34. In addition, the tracking circuit 20 regulates the first voltage potential $V_N$ between the first bias voltage output ($V_{BIAS1}$) 44 and the charge pump output 34 to be substantially the same as a second voltage potential Vp between the charge pump output 34 and the second bias voltage output ($V_{BIAS2}$) 48.

To provide for proper operation, the second pump up pulse 38 and the second pump down pulse 40 may be level shifted based upon the first bias voltage output ($V_{BIAS1}$) 44 and the second bias voltage output ($V_{BIAS2}$) 48.

FIG. 2 further depicts the first controlled current source 12 and the second controlled current source 14 of FIG. 1 coupled to a current mirror structure. The current mirror structure includes a sourced current mirror 52 and a sink current mirror 54. The sourced current mirror 52 includes a third transistor (M3) 56, which may be configured as an always on diode, coupled in series with a fourth transistor (M4) 58, where the current through the first sourced current mirror 52 is set by a current sink source (I1) 60.

The source current mirror 52 further includes a fifth transistor (M5) 62 coupled in series with a sixth transistor (M6) 64. The gate of the fifth transistor (M5) 62 is coupled to the first reference DC voltage 66, which is also coupled to the gate of the fourth transistor (M4) 58. The first reference DC voltage 66 on the gate of the forth transistor (M4) 58 turns on the fourth transistor (M4) 58 and fifth transistor (M5) 62. As a result, the fourth transistor (M4) 58 and fifth transistor (M5) 62 are always turned on and permit current to flow from the source voltage ($V_{DD}$) 22 through the third transistor (M3) 56 and the sixth transistor (M6) 64. As a result, the current passing through the third transistor (M3) 56 and fourth transistor (M4) 58 is mirrored by the current passing through the sixth transistor (M6) 64 and fifth transistor (M5) 62, respectively.

The sink current mirror 54 includes a seventh transistor (M7) 68 coupled in series with an eighth transistor (M8) 70. The eighth transistor (M8) 70 is configured as an always on diode. The seventh transistor (M7) 68 is always turned on by a second reference DC voltage 72.

The first controlled current source 12 includes a ninth transistor (M9) 74 coupled in series with a tenth transistor (M10) 76, which is coupled to a supply voltage ($V_{DD}$) 22. The second controlled current source 14 includes an eleventh transistor (M11) 78 coupled in series with a twelfth transistor (M12) 80. The twelfth transistor (M12) 80 is also coupled to a common supply voltage 28.

The diode connected gate and drain voltage of the third transistor (M3) 56 provides the source bias voltage ($V_{CSBIAS1}$) that is with respect to the supply rail ($V_{DD}$) 22 for the sixth transistor (M6) 64 gate and biasing the ninth transistor (M9) 74 gate on the first current controlled source 12. Based upon the first current source bias voltage ($V_{CSBIAS1}$), the on-current provided by the first controlled current source is set. The first pump up pulse 26 provides a negative going pulse that is level shifted relative to the supply rail ($V_{DD}$) 22 to control the on state and the off state of the tenth transistor (M10) 76. Turning the tenth transistor (M10) 76 to the on state permits current to flow through the ninth transistor (M9) 74 based upon the first current source bias voltage ($V_{CSBIAS1}$).

In a similar fashion, the second controlled current source 14 includes an eleventh transistor (M11) 78 coupled in series with a twelfth transistor (M12) 80. The current provided by the second controlled current source 14 is based upon the biasing of the eleventh transistor (M11) 78 and controlled by the twelfth transistor (M12) 80. The eleventh transistor (M11) 78 is biased based upon the second current source bias voltage ($V_{CSBIAS2}$) at the gate of the eighth transistor (M8) 70. Current flowing through the eleventh transistor (M11) 78 is controlled based upon the state of operation of the twelfth transistor (M12) 80, which depends upon the first pump down pulse 32.

During normal operation, the tenth transistor (M10) 76 acts as a switch and the difference between the supply voltage ($V_{DD}$) 22 and the charge pump output 34 is dropped across the ninth transistor (M9) 74 and the first pass transistor (M1) 16. Consequently, the ninth transistor (M9) 74 and the first pass transistor (M1) 16 each see half the normal voltage drop. In addition, controlling the voltage at the n-well input 46 limits the range of the voltage drop across first transistor (M1) 16. As a result, the voltage drop across the ninth transistor (M9) 74 is likewise controlled.

Similarly, the twelfth transistor (M12) 80 also acts as a switch and the difference between the charge pump output 34 and the common supply voltage 28 is dropped across the second pass transistor (M2) 18 and the eleventh transistor (M11) 78. Consequently, the total voltage drop across the second pass transistor (M2) 18 and the eleventh transistor (M11) 78 is shared. In addition, controlling the voltage at the p-well input 50 limits the range of the voltage drop across the second pass transistor (M2) 18. As a result, the voltage across the eleventh transistor (M11) 78 is also controlled.

FIG. 3 depicts an example of tracking circuit 20 using bipolar transistors with a maximum voltage rating higher than the charge pump supply. A current source (I1) 82 provides a reference current for a current sourcing mirror made up of a first transistor (Q1) 84, a second transistor (Q2) 86, a third transistor (Q3) 88, and a fourth transistor (Q4) 90. The current from the second transistor (Q2) 86 supplies a current sinking mirror composed of fifth transistor (Q5) 92, a sixth transistor (Q6) 94, and a seventh transistor (Q7) 96. A zener diode (D1) 98 is used to shunt regulate the potential $V_{NP}$ between the first bias voltage output ($V_{BIAS1}$) 44 and the second bias voltage ($V_{BIAS2}$) 48. A first resistor (R1) 100 and a second resistor (R2) 102 are equal valued. Current passing through the first resistor (R1) 100 and the second resistor (R2) 102 provide voltage offsets between the tracking voltage input 42 and the respective first bias voltage output ($V_{BIAS1}$) 44 and the second bias voltage ($V_{BIAS2}$) 48.

Selecting resistance values for the first resistor (R1) 100 and the second resistor (R2) 102 to be equal in value, the voltage at the gate of a first field effect transistor (M1) 108 and the gate of a second field effect transistor M2 (106) is equal to the average of the voltage at the first bias voltage ($V_{BIAS1}$) 44 and the second bias voltage ($V_{BIAS2}$) 48.

The average of the voltage at the first bias voltage ($V_{BIAS1}$) 44 and the second bias voltage ($V_{BIAS2}$) 48 and the charge pump output voltage are the input to a feedback loop that forces the average of the first bias voltage ($V_{BIAS1}$) 44 and the second bias voltage ($V_{BIAS2}$) 48 to follow the charge pump output voltage when it is between half the Zener voltage of zener diode (D1) 98 and half the Zener voltage of the zener diode (D1) 98 less than the supply voltage.

A feedback amplifier 107 has two input differential pairs. The first differential pair includes a P-channel transistor pair composed of a first field effect transistor (M1) 108 and a second field effect transistor (M2) 106, which are fed by the seventh transistor (Q7) 96. The second differential pair includes an N-channel transistor pair composed of a third field effect transistor (M3) 110 and a fourth field effect transistor (M4) 104, which is fed by the fourth transistor (Q4) 90. The output of the first differential pair and the second differential pair goes through several current mirrors composed of an eighth transistor (Q8) 112, a ninth transistor (Q9) 114, a tenth transistor (Q10) 116, a eleventh transistor (Q11) 118, a twelfth transistor (Q12) 120, and a thirteenth transistor (Q13) 122 that combine to pull "$V_{BIAS1}$" 44 and "$V_{BIAS2}$" 48 down through a fourteenth transistor (Q14) 124 or up through a fifteenth transistor (Q15) 126.

Those skilled in the art will recognize improvements and modifications to the embodiments of the present disclosure. All such improvements and modifications are considered within the scope of the concepts disclosed herein and the claims that follow.

What is claimed is:

1. A charge pump comprising:
   a first pass transistor having a control input, a first output, a second output and an n-well input;
   a second pass transistor having a control input, a first output, a second output and a p-well input, wherein the first output of the first pass transistor is coupled to the first output of the second pass transistor to create a charge pump output;
   a first current source including a first current source output coupled to the second output of the first pass transistor;
   a second current source including a second current source output coupled to the second output of the second pass transistor; and
   a tracking circuit including a tracking voltage input coupled to the charge pump output, a first bias voltage output coupled to the n-well input of the first pass transistor, and
   a second bias voltage output coupled to the p-well input of the second pass transistor,
   wherein the tracking circuit is configured to continuously regulate the first bias voltage output at the n-well input of the first pass transistor and the second bias voltage output at the p-well input of the second pass transistor relative to a charge pump output voltage at the charge pump output.

2. The charge pump of claim 1 wherein the first pass transistor and the second pass transistor are field effect transistors.

3. The charge pump of claim 1 wherein the control input of the first pass transistor is coupled to a pump up voltage signal that is level shifted relative to the first bias voltage output coupled to the n-well input; and
   wherein the control input of the second pass transistor is coupled to a pump down voltage signal that is level shifted relative to the second bias voltage output coupled to the p-well input.

4. The charge pump of claim 1 wherein the tracking circuit includes a zener diode, and wherein the zener diode shunt regulates the first bias voltage output relative to the second bias voltage output.

5. The charge pump of claim 1 wherein the first current source is a controlled current source including a first control input, and the first control input is coupled to a pump up voltage signal that is level shifted relative to a supply voltage; and
   wherein the second current source is a controlled current source including a second control input, and the second control input is coupled to a pump down voltage signal that is level shifted relative to a common voltage.

6. The charge pump of claim 5, wherein the pump up voltage signal is a first pump up voltage signal, and the pump down voltage signal is a first pump down voltage signal;
   wherein the first current source includes:
   a third transistor including a control input, a first output, and a second output, wherein the control input is configured to receive the first pump up voltage signal, and the second output of the third transistor is in communication with the supply voltage;
   a fourth transistor including a control input, a first output and a second output, wherein the control input of the fourth transistor is coupled to a first bias voltage of a current mirror circuit, the second output of the fourth transistor is coupled to the first output of the third transistor, and the first output of the fourth transistor is coupled to the first current source output; and
   wherein the second current source includes:
   a fifth transistor including a control input, a first output, and a second output, wherein the control input of the fifth transistor is configured to receive the first pump down voltage signal, and the second output of the fifth transistor is in communication with the common voltage;
   a sixth transistor including a control input, a first output, and a second output, wherein the control input is coupled to a second bias voltage of the current mirror circuit, the first output of the sixth transistor is coupled to a first output of the fifth transistor, and the second output of the sixth transistor is coupled to the second current source output.

7. The charge pump of claim 1 wherein a voltage potential between the first bias voltage output and the second bias voltage output is substantially constant.

8. The charge pump of claim 1 wherein a first voltage potential between the first bias voltage output and the charge pump output is substantially the same as a second voltage potential between the charge pump output and the second bias voltage output.

9. The charge pump of claim 1 further comprising current mirror circuitry, the current mirror circuitry including a first bias voltage output and a second bias voltage output;
   wherein the first current source includes a first current source bias input coupled to the first bias voltage output of the current mirror circuitry; and
   wherein the second current source includes a second current source bias input coupled to the second bias voltage output of the current mirror circuitry.

10. The charge pump of claim 1 wherein the first current source is a controlled current source including a first control input, and the first control input is coupled to a pump up voltage signal that is level shifted relative to a supply voltage; and
   wherein the second current source is a controlled current source including a second control input, and the second control input is coupled to a pump down voltage signal that is without a level shift relative to a common voltage.

11. A method of generating a charge pump voltage comprising:
   generating a charge pump output voltage with a first pass transistor and a second pass transistor;
   continuously controlling a potential between a well voltage of the first pass transistor relative to the charge pump output voltage and the charge pump output voltage relative to a well voltage of the second pass transistor to be substantially the same.

12. The method of claim 11 wherein the first pass transistor is a p-type transistor and the second pass transistor is an n-type transistor.

13. The method of claim 11 wherein the first pass transistor and the second pass transistor are field effect transistors.

14. The method of claim 11 further comprising
   providing charge to the charge pump output voltage with the first pass transistor; and
   sinking charge from the charge pump output voltage with the second pass transistor.

15. The method of claim 11 wherein controlling the potential between the well voltage of the first pass transistor relative to the charge pump output voltage and the charge pump output voltage relative to the well voltage of the second pass transistor to be substantially the same further comprises:
   regulating a difference between the well voltage of the first pass transistor and the well voltage of the second pass transistor to be substantially constant over a range of the charge pump voltage output.

* * * * *